(12) United States Patent
Bierhuizen et al.

(10) Patent No.: US 8,803,171 B2
(45) Date of Patent: Aug. 12, 2014

(54) REDUCED COLOR OVER ANGLE VARIATION LEDS

(75) Inventors: Serge J. Bierhuizen, Santa Rosa, CA (US); Oleg B. Shchekin, San Francisco, CA (US)

(73) Assignee: Koninklijke Philips N.V., Eindhoven (NL)

( * ) Notice: Subject to any disclaimer, the term of this patent is extended or adjusted under 35 U.S.C. 154(b) by 743 days.

(21) Appl. No.: 12/507,493

(22) Filed: Jul. 22, 2009

(65) Prior Publication Data
US 2011/0018016 A1    Jan. 27, 2011

(51) Int. Cl.
*H01L 33/00* (2010.01)

(52) U.S. Cl.
USPC .......................................... 257/98

(58) Field of Classification Search
USPC .......................................... 257/98
See application file for complete search history.

(56) References Cited

U.S. PATENT DOCUMENTS

| | | | |
|---|---|---|---|
| 7,361,938 B2 | 4/2008 | Mueller et al. | |
| 7,511,312 B2 * | 3/2009 | Chae et al. | 257/98 |
| 2005/0280014 A1 * | 12/2005 | Park et al. | 257/98 |
| 2006/0071223 A1 | 4/2006 | Richter et al. | |
| 2006/0258028 A1 * | 11/2006 | Paolini et al. | 438/22 |
| 2007/0085103 A1 * | 4/2007 | Nishioka et al. | 257/99 |
| 2007/0096130 A1 | 5/2007 | Schiaffino et al. | |
| 2007/0267643 A1 | 11/2007 | Harada et al. | |
| 2008/0023714 A1 | 1/2008 | Chae et al. | |
| 2009/0050919 A1 * | 2/2009 | Weijers et al. | 257/98 |
| 2009/0086475 A1 | 4/2009 | Caruso et al. | |
| 2009/0321758 A1 * | 12/2009 | Liu et al. | 257/98 |

FOREIGN PATENT DOCUMENTS

| | | |
|---|---|---|
| DE | 10349038 A1 | 5/2004 |
| JP | 2003046134 A | 2/2003 |
| JP | 2003-110146 | 4/2003 |
| JP | 2004349646 | 12/2004 |
| JP | 2004349647 A | 12/2004 |
| JP | 2005268323 A | 9/2005 |
| JP | 2007158009 | 6/2007 |
| WO | 2006126119 A2 | 11/2006 |
| WO | 2007007236 A2 | 1/2007 |

OTHER PUBLICATIONS

Philips Lumileds U.S. Appl. No. 12/236,527.
Philips Lumileds U.S. Appl. No. 12/433,972.

* cited by examiner

*Primary Examiner* — Scott B Geyer

(57) ABSTRACT

A light emitting diode (LED) package includes an LED die includes a stack of semiconductor layers including an active region, and a wavelength converting element over the LED die. The wavelength converting element includes two or more non-flat surfaces that produce a desired angular color distribution pattern.

13 Claims, 8 Drawing Sheets

REDUCED COLOR OVER ANGLE VARIATION LEDS

CROSS REFERENCE TO RELATED APPLICATION

This application is related to U.S. patent application Ser. No. 12/236,527, entitled "LED with Controlled Angular Non-Uniformity," filed on Sep. 24, 2008, which is commonly assigned and incorporated herein by reference.

FIELD OF INVENTION

The present disclosure relates to light-emitting diode (LED) packages and, in particular, to LED packages with a desired color over angle variation for illumination applications.

DESCRIPTION OF RELATED ART

Lighting devices that use light emitting diodes (LEDs) are becoming increasingly common in many lighting applications. Generally, LEDs use phosphor conversion of the primary emission to generate white light, but phosphors can also be used to create more saturated colors like red, green, and yellow.

A problem found in many phosphor converted LEDs is the color over angle (COA) variation of the light that is produced. Typically light that is emitted at higher angles from the phosphor layers will have longer wavelengths than the light that is emitted at lower angles because the light at higher angles is less direct and has a greater opportunity to be converted by the phosphor. The result is that the color of the emitted light is angle dependent. The COA variation may be desired in some systems and disfavored in others. Thus, solutions for controlling the COA variation are desired.

SUMMARY

In some embodiments of the present disclosure, a light emitting diode (LED) package includes an LED die includes a stack of semiconductor layers including an active region, and a wavelength converting element over the LED die. The wavelength converting element includes one or more non-flat surfaces that produce a desired angular color distribution pattern.

BRIEF DESCRIPTION OF THE DRAWINGS

In the drawings.

Use of the same reference numbers in different figures indicates similar or identical elements.

DETAILED DESCRIPTION

Figure 1:
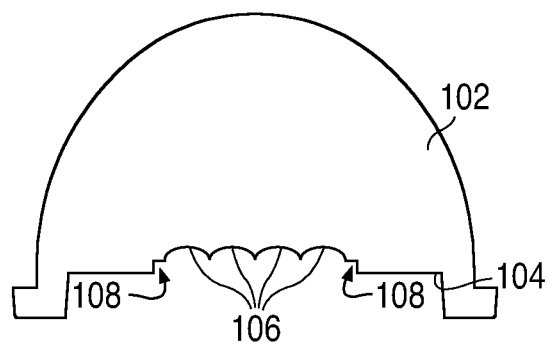
FIG. 1 illustrates a cross sectional view of a lens with one or more curved or substantially curved surfaces.
Figure 2:
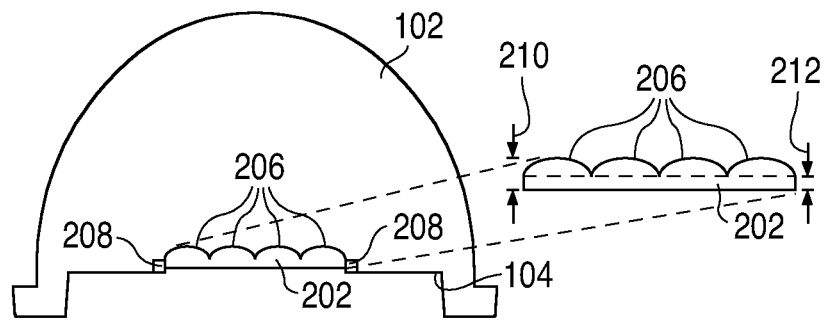
FIG. 2 illustrates a cross sectional view of the lens of FIG. 1 where the curved surfaces filled with a wavelength converting material to form a wavelength converting element having one or more curved or substantially curved emitting surfaces.
Figure 3:
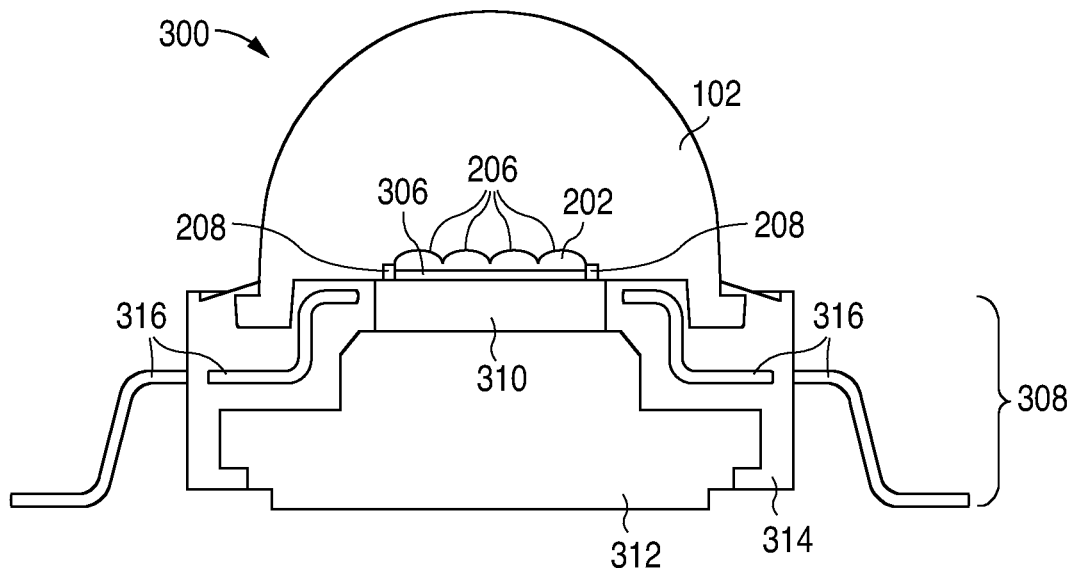
FIG. 3 illustrates a cross sectional view of a light emitting diode (LED) package with the lens of FIG. 2.

FIGS. 1 to 3 illustrate the fabrication of a light-emitting diode (LED) package 300 (FIG. 3) with a desired color over angle (COA) variation in one or more embodiments of the present disclosure. Referring to FIG. 1A, a lens 102 has a dome like shape to help extract light from a light source. The bottom 104 of lens 102 includes one or more curved or otherwise non-flat surfaces 106. A non-flat surface may be a substantially curved surface, such as stepped, angled, or otherwise shaped surface used to emulate a curved surface. Curved surfaces 106 may be molded or drilled into the bottom 104 of lens 102. A rim 108 is defined around the perimeter of non-flat surfaces 106. Lens 102 may be glass, sapphire, diamond, alumina, or silicone.

Referring to FIG. 2, a wavelength converting material is deposited over curved surfaces 106 to form a wavelength converting element 202. The wavelength converting material may be one or more types of phosphors in a binder material such as silicone. The phosphors may be aluminum garnet phosphors with the general formula $(Lu_{1-x-y-a-b}Y_xGd_y)_3(Al_{1-z}Ga_z)_5O_{12}:Ce_aPr_b$ wherein $0<x<1$, $0<y<1$, $0<z\leq0.1$, $0<a\leq0.2$ and $0<b\leq0.1$, such as $Lu_3Al_5O_{12}:Ce^{3+}$ and $Y_3Al_5O_{12}:Ce^{3+}$, which emit light in the yellow-green range; and $(Sr_{1-x-y}Ba_xCa_y)_{2-z}Si_{5-a}Al_aN_{8-a}Oa:EuZ_{2+}$ wherein $0\leq a<5$, $0<x\leq1$, $0\leq y\leq1$, and $0<z\leq1$ such as $Sr_2Si_5N_8:Eu^{2+}$, which emit light in the red range. Other green, yellow, and red emitting phosphors may also be suitable, including $(Sr_{1-a-b}Ca_bBa_c)Si_xN_yO_z:Eu^{a2+}$ (a=0.002-0.2, b=0.0-0.25, c=0.0-0.25, x=1.5-2.5, y=1.5-2.5, z=1.5-2.5) including, for example, $SrSi_2N_2O_2:Eu^{2+}$; $(Sr_{1-u-v-x}Mg_uCa_vBa_x)(Ga_{2-y-z}Al_yInzS_4):Eu^{2+}$ including, for example, $SrGa_2S_4:Eu^{2+}$; $Sr_{1-x}Ba_xSiO_4$:

$Eu^{2+}$; and $(Ca_{1-x}Sr_x)S:Eu^{2+}$ wherein $0<x\leq1$ including, for example, $CaS:Eu^{2+}$ and $SrS:Eu^{2+}$.

Wavelength converting element 202 has one or more curved or otherwise non-flat emitting surfaces 206 defined by curved or otherwise non-flat surfaces 106 (FIG. 1). A non-flat surface is an intentionally created surface outside of imperfections within manufacturing tolerance. A non-flat surface may be defined as a surface that has a change in height 210 from the lowest point to the highest point of the surface that is greater than 10% of the average height 212 of wavelength converting element 202. As described above, a non-flat surface may be a substantially curved surface, such as stepped, angled, or otherwise shaped surface used to emulate a curved surface.

The combination of curved emitting surfaces 206 of wavelength converting element 202 and the dome like shape of lens 102 provide the COA variation desired for a given application. A method for designing curved emitting surfaces 206 of wavelength converting element 202 is explained later in reference to FIG. 15. Examples of curved emitting surfaces 206 are described later in reference to FIGS. 16 to 19.

A reflective or scattering material is deposited in rim 108 to form a side coating 208 around the edge of wavelength converting element 202. Side coating 208 helps to control edge emission from wavelength converting element 202 and the LED die. Side coating 208 may be a polymer or a resin with reflective particles, such as silicone, epoxy, or acrylic with $TiO_2$. Alternatively side coating 208 may be a thin metal film such as Al, Ag, Cr, Au, Ni, V, Pt, Pd, or a combination thereof Referring to FIG. 3, lens 102 is mounted over an LED die 306 on a support 308. LED die 306 may include an n-type layer, a light-emitting layer (common referred to as the "active region") over the n-type layer, a p-type layer over the light-emitting layer, a conductive reflective layer over the p-type layer, and a guard metal layer over the conductive reflective layer. One or more n-type bond pads provide electrically contact to the n-type layer, and one or more p-type bond pads provide electrical contact to the conductive reflective layer for the p-type layer.

Support 308 may include a submount or interposer 310, a heat sink 312, and a housing 314. LED die 306 is mounted on submount 310. Submount 310 has a substrate with through-via or on-submount redistribution of the metal pattern of LED die 306. Submount 310 is mounted over heat sink 312. Heat sink 312 dissipates heat from LED die 306. Heat sink 312 is received in housing 314. Bond wires electrically couple the pads on submount 310 to electrical leads 316 of housing 310, which pass electrical signals between LED package 300 and external components.

Figure 4:
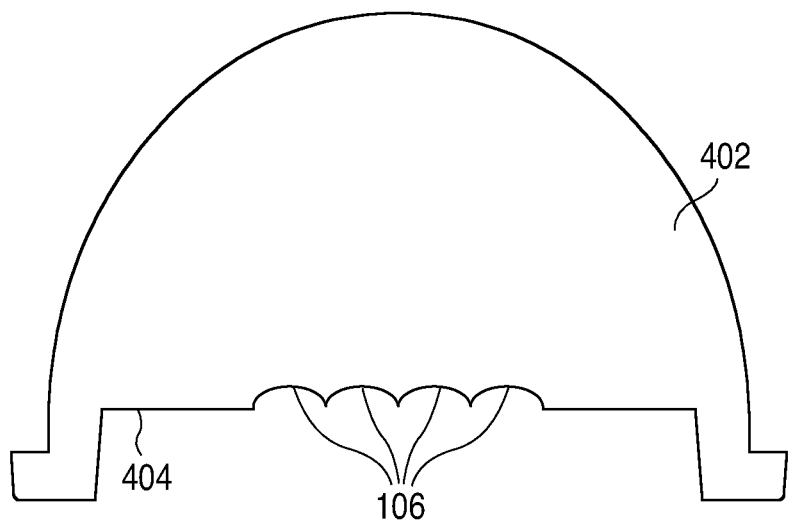
FIG. 4 illustrates a cross sectional view of a lens with one or more curved or substantially curved surfaces.
Figure 5:
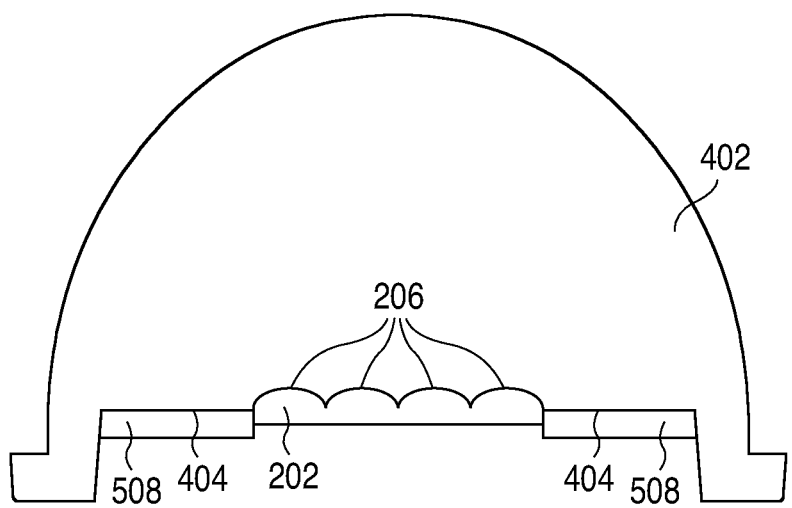
FIG. 5 illustrates a cross sectional view of the lens of FIG. 4 where the curved surfaces filled with a wavelength converting material to form a wavelength converting element having one or more curved or substantially curved emitting surfaces and side coating.

FIG. 4 illustrates a lens 402 in one or more embodiment of the present disclosure. Lens 402 may replace lens 102 in LED package 300. Lens 402 is similar to lens 102 except for the following. Lens 402 does not include a rim 108 around curved surfaces 106. As FIG. 5 shows, a side coating 508 is formed on the bottom 404 of lens 402 from the edge of wavelength converting element 202 to the perimeter of the lens. Side coating 508 may be a similar material as side coating 208 described above.

In another alternative embedment, lens 102 or 402 may be filled with phosphor, thereby making the lens a wavelength converting element with curved or substantially curved emitting surfaces 106. The void left by wavelength converting element 202 may be filled with a silicone without any phosphor.

Figure 6:
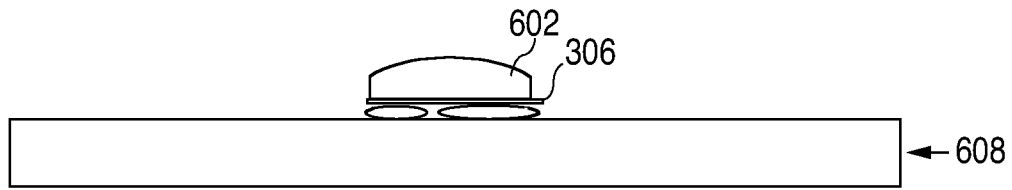
FIG. 6 illustrates a wavelength converting material deposited on an LED die on a support.
Figure 7:
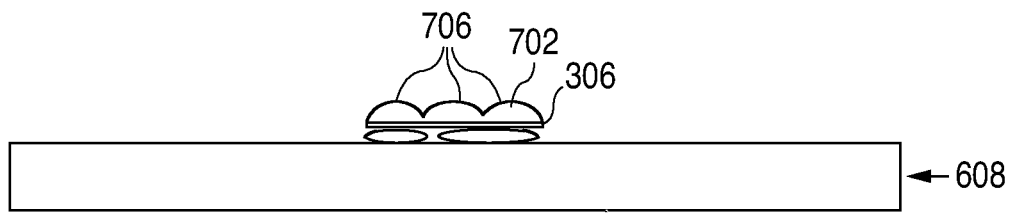
FIG. 7 illustrates a wavelength converting element molded from the wavelength converting material of FIG. 6.
Figure 8:
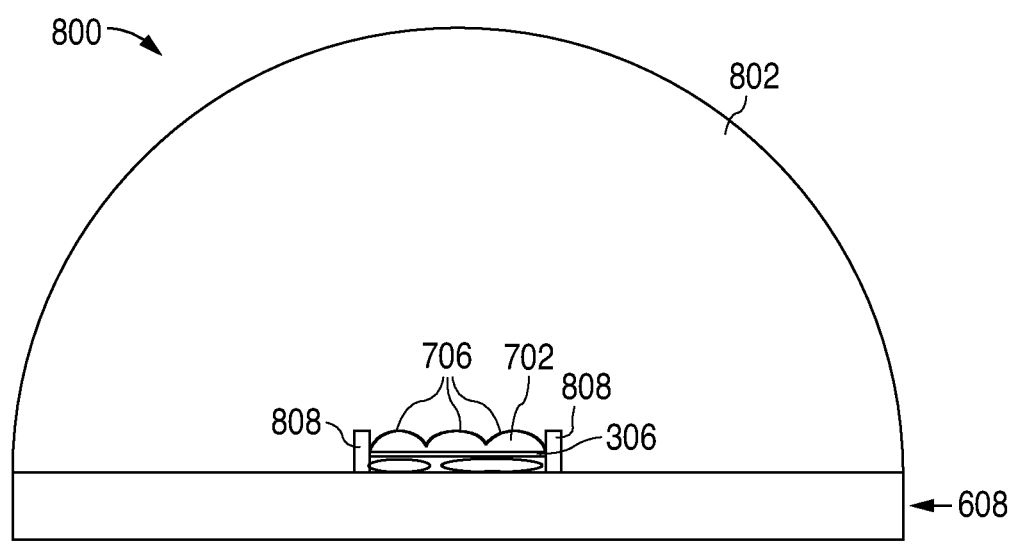
FIG. 8 illustrates an LED package with the wavelength converting element of FIG. 7.

FIGS. 6 to 8 illustrate the construction of an LED package 800 (FIG. 8) with a desired COA variation in one or more embodiments of the present disclosure. Referring to FIG. 6, LED die 306 is mounted over a support 608. Although not shown, support 608 may include a submount, a heat sink, and a housing as described above for support 308. A wavelength converting material 602 is deposited over LED die 306. Wavelength converting material 602 may be a similar material as wavelength converting element 202 described above.

Referring to FIG. 7, wavelength converting material 602 (FIG. 6) is shaped by a mold to form a wavelength converting element 702 with one or more curved or otherwise non-flat emitting surfaces 706 (similar to surfaces 206 described above).

Referring to FIG. 8, side coating 808 is applied to the lateral sides of LED die 306 and wavelength converting element 702. Side coating 808 may be a similar material as side coating 208 described above. A lens 802 is molded over support 608 to encapsulate LED 306 and wavelength converting element 702 to complete LED package 800. Lens 802 may be silicone or epoxy. Lens 802 has a dome like shape to help extract light from a light source.

The combination of curved emitting surfaces 706 of wavelength converting element 702 and the dome like shape of lens 802 provide the COA variation desired for a given application. A method for designing curved emitting surfaces 706 of wavelength converting element 702 is explained later in reference to FIG. 15. Examples of curved emitting surfaces 706 are described later in reference to FIGS. 16 to 19.

Figure 9:
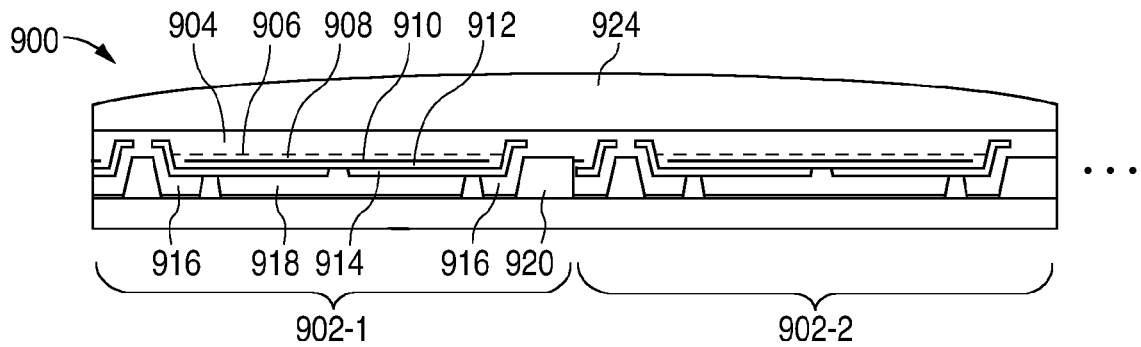
FIG. 9 illustrates a cross sectional view of a wavelength converting material deposited on a device wafer with LED dies.
Figure 10:
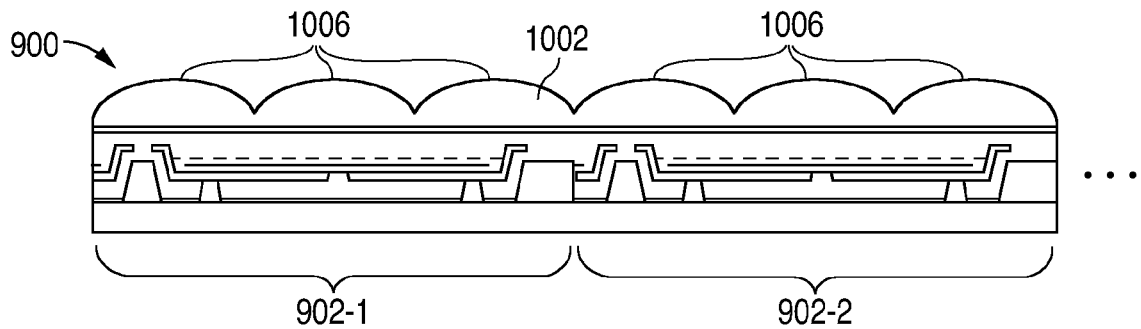
FIG. 10 illustrates a cross sectional view of a wavelength converting elements molded from the wavelength converting material of FIG. 9.
Figure 11:
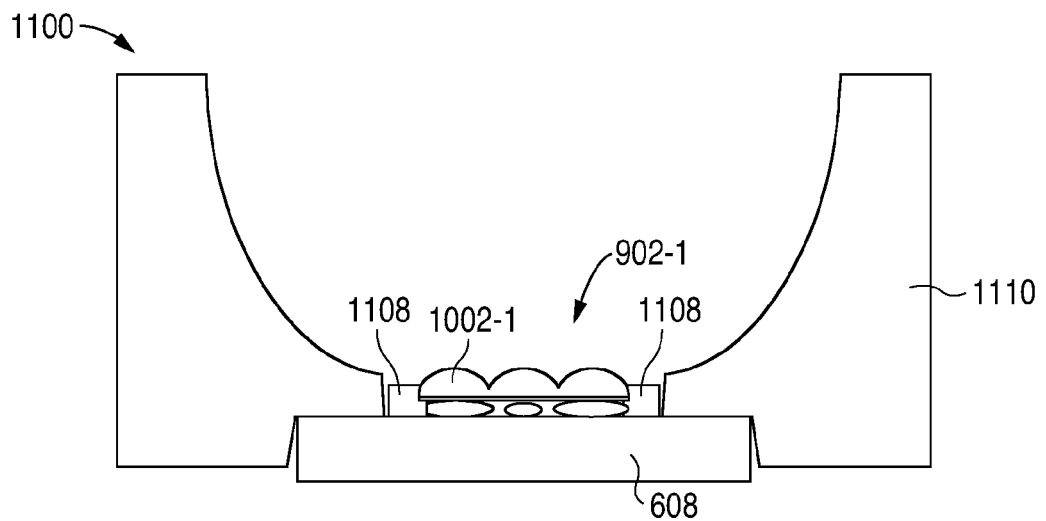
FIG. 11 illustrates a cross sectional view of an LED package with one of the LED dies and one of the wavelength converting element of FIG. 10.

FIGS. 9 to 11 illustrate the wafer scale fabrication of an LED package 1100 (FIG. 11) with a desired COA variation in one or more embodiments of the present disclosure. Referring to FIG. 9, a device wafer 900 with multiple LED dies 902 is illustrated. For simplicity, only LED dies 902-1 and 902-2 are illustrated but it is understood that device wafer 900 may include many similarly LED dies.

LED die 902-1 includes an n-type layer 904 epitaxially grown over a now removed growth wafer, a light-emitting layer 906 (also common referred to as an "active layer") epitaxially grown over the n-type layer, a p-type layer 908 epitaxially grown over the light-emitting layer, a conductive reflective layer 910 formed over the p-type layer, and a guard metal layer 912 formed over the conductive reflective layer. A dielectric layer 914 is formed over the structures.

Openings are formed in the various layers to provide access to n-type layer 904 and conductive reflective layer 910 for p-type layer 908. One or more n-type bond pads 916 are formed to electrically contact n-type layer 904, and one or more p-type bond pads 918 are formed to electrically contact conductive reflective layer 910. Bond pads 916 and 918 may extend to the die edge and cover a substantial portion of the backside of LED die 902-1 (e.g., greater than 85%) to provide mechanical support to the LED die. For more details on bond pads 916 and 918, please refer to U.S. patent application Ser. No. 11/611,775, entitled "LED Assembly Having Maximum Metal Support for Laser Lift-off of Growth Substrate," filed on Dec. 15, 2006, which is commonly assigned and incorporated herein by reference. LED die 902-2 has a similar structure as LED die 902-1.

A removable adhesive 920 is applied over the bottom of device wafer 900 and a carrier wafer 920 is then bonded to the bottom of device wafer 900. A wavelength converting material 924 is deposited over the top of device wafer 900. Wavelength converting material 924 may be a similar material as wavelength converting element 902 described above.

Referring to FIG. 10, wavelength converting material 924 (FIG. 9) is shaped by a mold to form wavelength converting elements 1002 with one or more curved or otherwise non-flat emitting surfaces 1006 (similar to surfaces 206 described above) over each die on device wafer 900. Curved emitting surfaces 1006 of wavelength converting elements 1002 provide the COA variation desired for a given application. A method for designing curved emitting surfaces 1006 of wavelength converting elements 1002 is explained later in reference to FIG. 15. Examples of curved emitting surfaces 1006 are described later in reference to FIGS. 16 to 19.

Alternatively, a flat mold may shape wavelength converting material 924 into a flat wavelength converting element. The flat wavelength converting element may be mechanically shaped to form wavelength converting elements 1002 with substantially curved emitting surfaces 1006. For example, the flat wavelength converting element may be milled or bead blasted with fine particles (e.g., salt) to form wavelength converting elements 1002 with substantially curved emitting surfaces 1006. Similar processes are described later in reference to FIGS. 13 and 14.

Device wafer 900 is then transferred from carrier wafer 920 to a stretch film. LED dies 902, along with wavelength converting elements 1002, are then singulated into individual dies with individual wavelength converting elements. LED dies 902 and wavelength converting elements 1002 may be singulated using a laser, a scribe, or a saw. The stretch film is then expanded to laterally separate LED dies 902 and a side coating 1108 (FIG. 11) is applied to the lateral sides of LED dies 902 and wavelength converting elements 1002. Side coating 1108 may be a similar material as side coating 208 described above. For more details regarding the application of side coating 1108, please refer to U.S. patent application Ser. No. 12/433,972, entitled "Controlling Edge Emission in Package-Free LED Die," filed on May 1, 2009, which is commonly assigned and incorporated by reference.

Referring to FIG. 11, a singulated LED die 902-1 with wavelength converting element 1002-1 is mounted over support 608. A reflector 1110 may be mounted to support 608 to shape the light from LED die 902-1 and wavelength converting element 1002-1.

Figure 12:
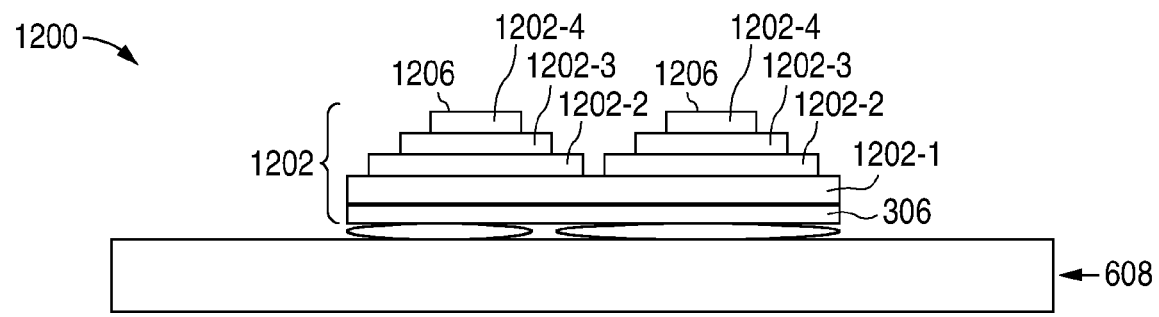
FIG. 12 is a cross sectional view of an LED package with a wavelength converting element having one or more stepped emitting surfaces.

FIG. 12 illustrates an LED package 1200 in one or more embodiments of the present disclosure. LED package 1200 includes LED die 306 mounted over support 608. A wavelength converting element 1202 is mounted over LED die 306. Wavelength converting element 1202 includes one or more stacks of ceramic phosphor plates. The phosphor plates have different lengths and widths so they provide stepped emitting surfaces 1206 that emulate the shape of the curved surfaces described above. Specifically, a large ceramic phosphor plate 1202-1 is mounted over LED die 306, and two stacks of ever smaller ceramic phosphor plates 1202-2, 1202-3, and 1202-4 are mounted over ceramic phosphor plate 1202-1 to emulate two curved surfaces. For details regarding the ceramic phosphor plates, please refer to U.S. Pat. No. 7,361,938, which is commonly assigned and incorporated herein by reference. Stepped emitting surfaces 1206 wavelength converting element 1202 provide the COA variation desired for a given application. A method for designing stepped emitting surfaces 1206 of wavelength converting elements 1202 or the curved surfaces emulated by the stepped surfaces is explained later in reference to FIG. 15. Examples of stepped emitting surfaces 1206 or the curved surfaces emulated by the stepped surfaces are described later in reference to FIGS. 16 to 19. Although not shown, a lens 802 may be molded over support 608 to encapsulate LED die 306 and wavelength converting element 1202 to complete LED package 1200.

Figure 13:
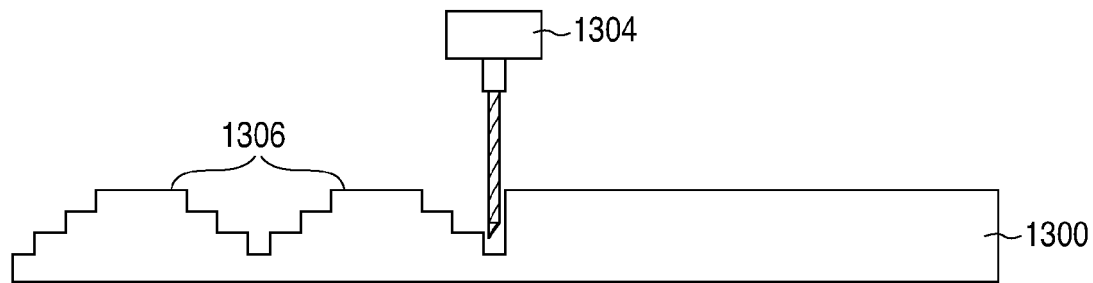
FIG. 13 is a cross sectional view of the fabrication of wavelength converting elements from a ceramic phosphor wafer.
Figure 14:
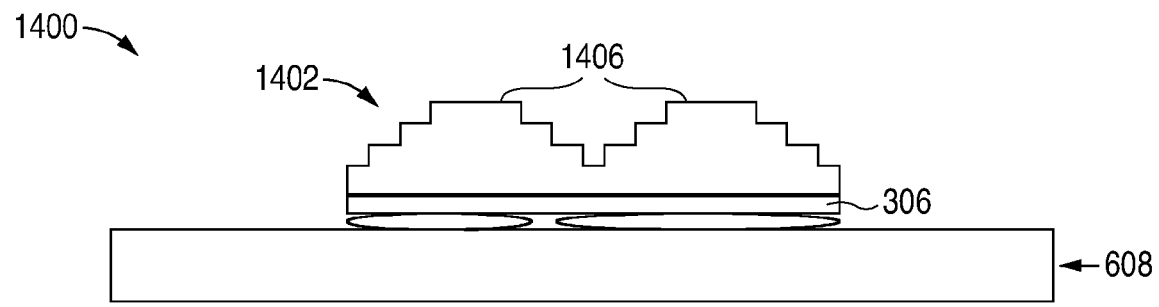
FIG. 14 is a cross sectional view of an LED package with an LED die and one of the wavelength converting element of FIG. 13.

FIGS. 13 and 14 illustrate the fabrication of an LED package 1400 (FIG. 14) in one or more embodiments of the present disclosure. FIG. 13 shows a wavelength converting wafer 1300 is mechanically shaped (i.e., milled or otherwise machined) with a tool 1304 to form stepped emitting surfaces 1306. Wavelength converting wafer 1300 may be a ceramic phosphor wafer. Instead of stepped emitting surfaces 1306, tool 1304 may be able to form curved or angled surfaces. Instead of being milled, wavelength converting element 1300 may be bead blasted with fine particles (e.g., salt) to form stepped, curved, or angled surfaces. Wavelength converting wafer 1300 is then singulated into individual wavelength converting elements 1402 (FIG. 14) with one or more curved, stepped, or angled surfaces 1406 (FIG. 14).

FIG. 14 shows that wavelength converting element 1402 is mounted over LED die 306, which is mounted over support 608, to complete LED package 1400. Stepped surfaces 1406 of wavelength converting element 1402 provide the COA variation desired for a given application. A method for designing stepped surfaces 1406 of wavelength converting elements 1402 or the curved surfaces emulated by the stepped surfaces is explained later in reference to FIG. 15. Examples of stepped surfaces 1406 or the curved surfaces emulated by the stepped surfaces are described later in reference to FIGS. 16 to 19. Although not shown, a lens 802 may be molded over support 608 to encapsulate LED die 306 and wavelength converting element 1402 to complete LED package 1400.

Figure 15:
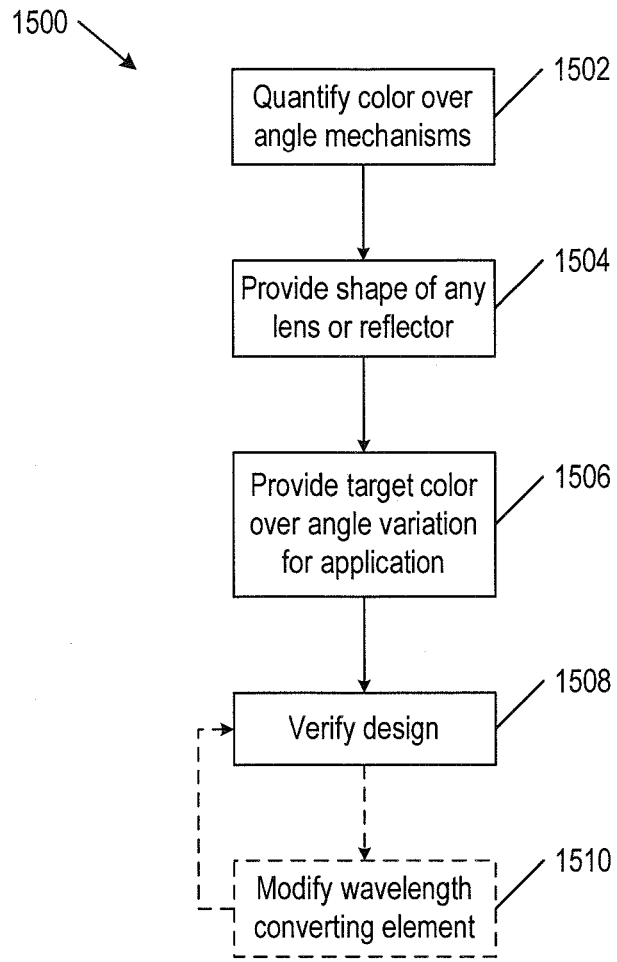
FIG. 15 is a flowchart of a method to design curved or substantially curved emitting surfaces of a wavelength converting element.

FIG. 15 is a flowchart of a method 1500 to design the curved, stepped, angled or otherwise non-flat surfaces of a wavelength converting element in one or more embodiments of the present disclosure. Method 1500 is implemented using a computer with an optical design software, such as Light Tools from Optical Research Associates of Pasadena, Calif.

In block 1502, the color over angle mechanisms are quantified in the optical design software. For example, the color over angle may be caused by different path lengths through the wavelength converting material, the uniform emission of phosphor, the lambertian emission of the LED, the scattering of phosphor particles, the scattering of LED die surface (from backwards emitted phosphor light), the scattering of the side coating, and the scattering from any dome lens. Block 1502 is followed by block 1504.

In block 1504, the shape of any lens is provided to the optical design software. Block 1504 is followed by block 1506.

In block 1506, the target COA variation is provided to the optical design software. The optical design software then models the design to determine the curved, stepped, or angled surfaces of the wavelength converting element that would provide the target COA variation. Block 1506 is followed by block 1508.

In block 1508, the design is verified by making a wavelength converting element, mounting the wavelength converting element over an LED die, and determining the actual COA variation from the assembly. Block 1508 may be followed by optional block 1510 when the actual COA does not meet the target COA.

In optional block 1510, the design of the wavelength converting element is modified to compensate for the difference between the actual COA and the target COA. Optional block 1510 is optionally followed by block 1508 where the new design of the wavelength converting element is verified.

Figure 16:
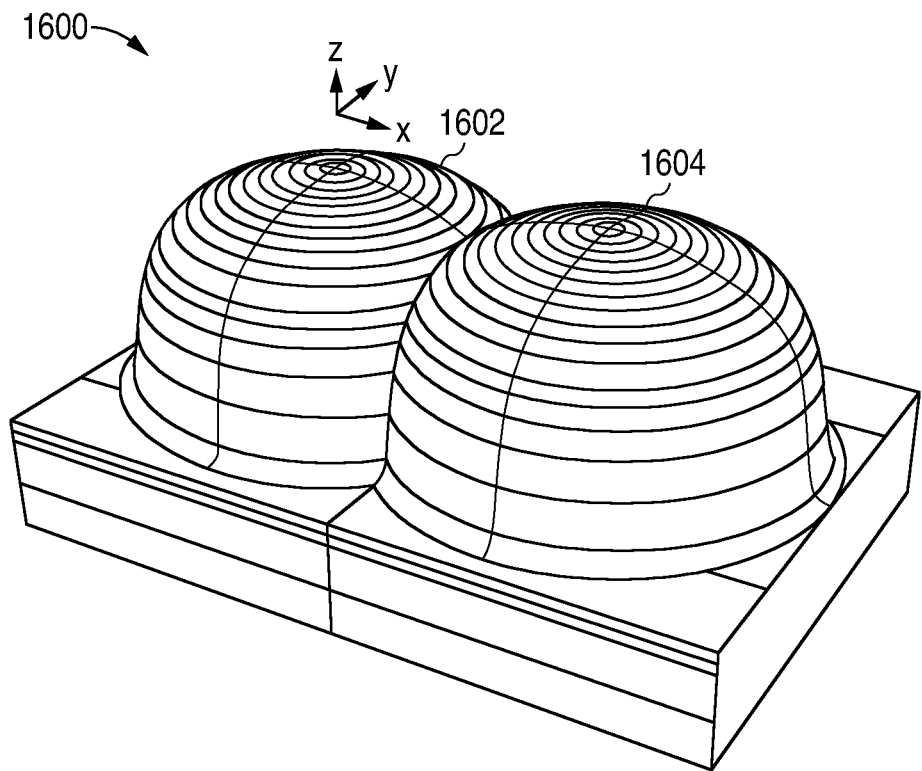
FIGS. 16 and 17 illustrate perspective and top views of a wavelength converting element with overlapping hemispherical emitting surfaces.

FIG. 16 illustrates an example wavelength converting element 1600 with curved or otherwise non-flat emitting surfaces 1602 and 1604 in one or more embodiments of the present disclosure. Contour lines are provided in curved surfaces 1602 and 1604 to better illustrate their curvature. Curved surfaces 1602 and 1604 may be overlapping hemispheres or other similar surfaces. Curved surfaces 1602 and 1604 may have the same shape or different shape in order to achieve the desired COA variation.

Figure 17:
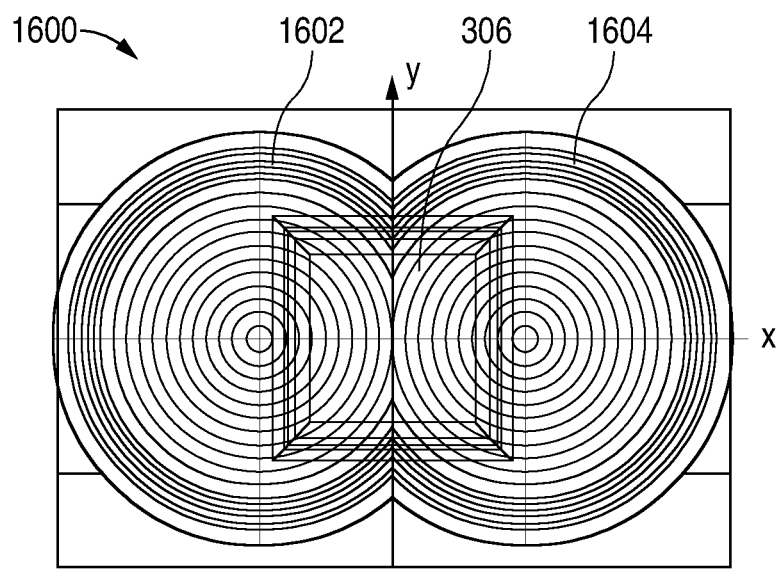

FIG. 17 shows the placement of LED die 306 relative to wavelength converting element 1600. Note that wavelength converting element 1600 may have an asymmetrical shape relative to LED die 306 so it is longer in one direction (e.g., X) than another direction (e.g., Y). This allows wavelength converting element 1600 to produce an asymmetrical COA distribution pattern or to compensate for an asymmetrical COA distribution pattern from the light source. Curved surfaces 1602 and 1604 may be used in the wavelength converting elements described above. Curved surfaces 1602 and 1604 may also be emulated by stepped or angled surfaces described above.

Figure 18:
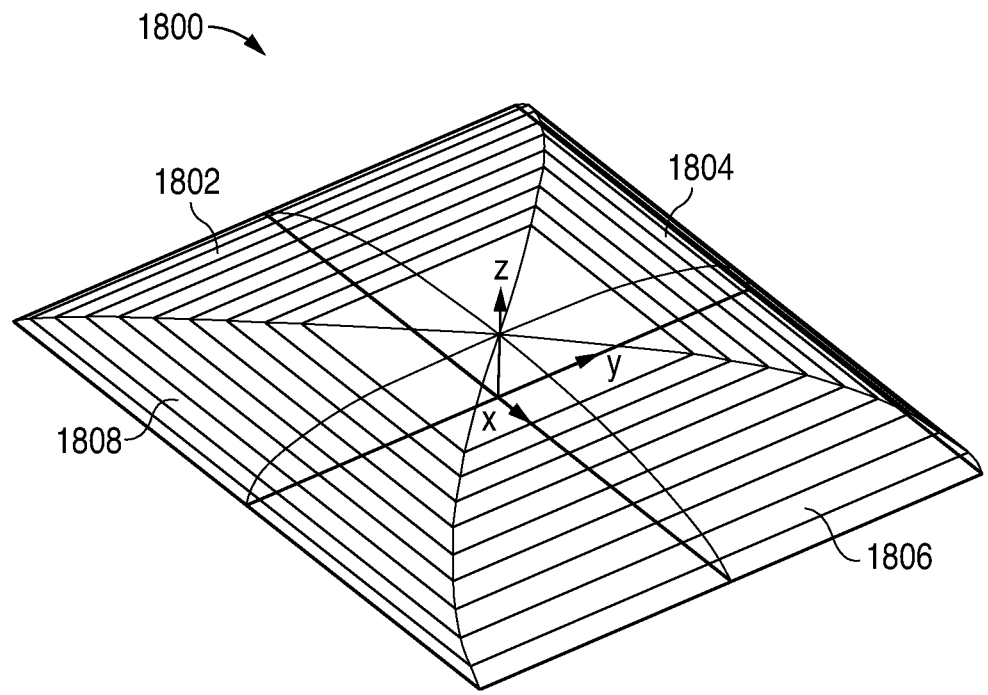
FIGS. 18 and 19 illustrate perspective and top views of a wavelength converting element with overlapping Bezier emitting surfaces, all arranged in accordance with embodiments of the invention.

FIG. 18 illustrates an example wavelength converting element 1800 with curved or otherwise non-flat emitting surfaces 1802, 1804, 1806, and 1808 in one or more embodiments of the present disclosure. Curved surfaces 1802, 1804, 1806, and 1808 are overlapping Bezier surfaces. Curved surfaces 1802, 1804, 1806, and 1808 may have the same shape or different shape in order to achieve the desired COA variation.

Figure 19:
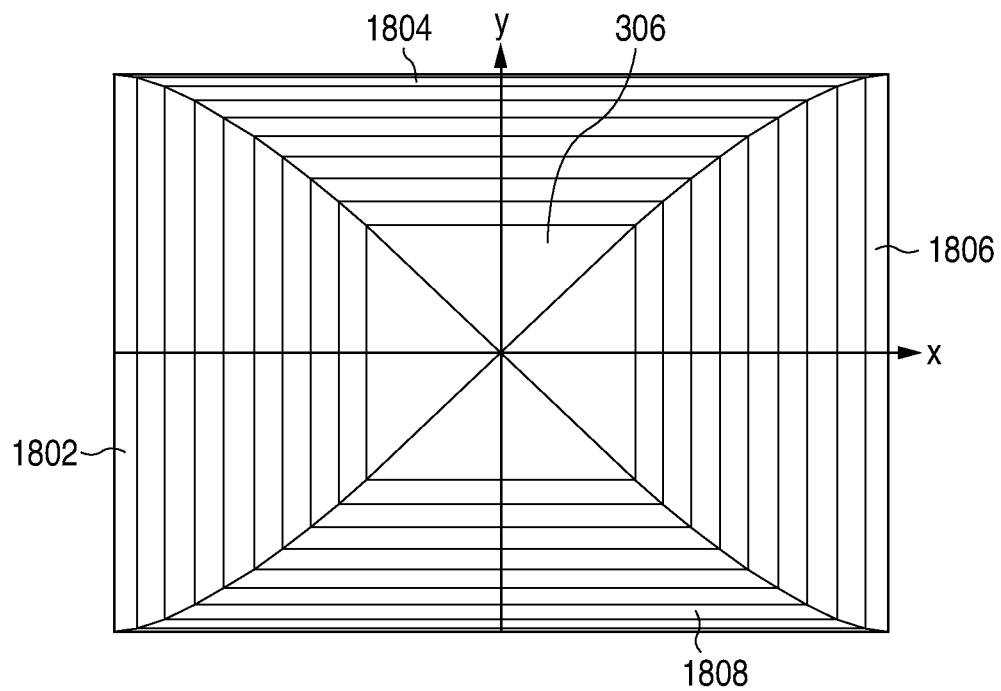

FIG. 19 shows the placement of LED die 306 relative to wavelength converting element 1800. Note that wavelength converting element 1800 may have a asymmetrical shape relative to LED die 306 so it is longer in one direction (e.g., X) than another direction (e.g., Y). This allows wavelength converting element 1800 to produce an asymmetrical COA distribution pattern or to compensate for an asymmetrical COA distribution pattern from the light source. Curved surfaces 1802, 1804, 1806, and 1808 may be used in the wavelength converting elements described above. Curved surfaces 1802, 1804, 1806, and 1808 may also be emulated by stepped or angled surfaces described above.

Various other adaptations and combinations of features of the embodiments disclosed are within the scope of the invention. Numerous embodiments are encompassed by the following claims.

What is claimed is:

1. A light-emitting diode (LED) package, comprising:
   a lens, the bottom of the lens defining a plurality of concave surfaces;
   a wavelength converting material disposed over the concave surfaces to form a wavelength converting element with a plurality of convex emitting surfaces arranged to produce a desired predetermined angular color distribution pattern; and
   an LED die under the wavelength converting element, the LED die comprising a stack of semiconductor layers including an active region.

2. The LED package of claim 1, wherein the wavelength converting material comprises phosphor in silicone.

3. The LED package of claim 1, wherein at least two of the convex emitting surfaces have different shapes.

4. The LED package of claim 1, wherein the wavelength converting element has an asymmetrical shape relative to X and Y axes centered about the LED die.

5. The LED package of claim 1, wherein the wavelength converting element is mounted directly on the LED die.

6. The LED package of claim 5, further comprising a reflective or scattering material deposited on the bottom of the lens to form a side coating around at least one of the wavelength converting element and the LED die to control edge emission.

7. The LED package of claim 5, wherein the bottom of the lens further defines a rim around the concave surfaces, the LED package further comprising a reflective or scattering material deposited in the rim to form a side coating around at least one of the wavelength converting element and the LED die to control edge emission.

8. A light-emitting diode (LED) package, comprising:
   an LED die comprising a stack of semiconductor layers including an active region; and
   a wavelength converting element over the LED die, the wavelength converting element comprising one or more ceramic phosphor plates that form a plurality of stepped emitting surfaces emulating a plurality of curved emitting surfaces arranged to produce a predetermined angular color distribution pattern.

9. The LED package of claim 8, wherein at least two of the stepped emitting surfaces have different shapes.

10. The LED package of claim 8, wherein the wavelength converting element has an asymmetrical shape relative to the LED die.

11. A light-emitting diode (LED) package, comprising:
    a dome shaped lens comprising a transparent material filled with phosphor, the bottom of the lens defining a plurality of concave surfaces; and
    an LED die under the lens, the LED die comprising a stack of semiconductor layers including an active region.

12. The LED package of claim 11, wherein at least two of the concave surfaces have different shapes.

13. The LED package of claim 11, wherein the concave surfaces are asymmetrical relative to X and Y axes centered about the LED die.

* * * * *